(12) United States Patent
Saruyama et al.

(10) Patent No.: US 10,299,382 B2
(45) Date of Patent: May 21, 2019

(54) CONNECTION BODY AND CONNECTION BODY MANUFACTURING METHOD

(71) Applicant: DEXERIALS CORPORATION, Tokyo (JP)

(72) Inventors: Kenichi Saruyama, Tochigi (JP); Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/112,872

(22) PCT Filed: Jan. 13, 2015

(86) PCT No.: PCT/JP2015/050620
§ 371 (c)(1),
(2) Date: Jul. 20, 2016

(87) PCT Pub. No.: WO2015/115161
PCT Pub. Date: Aug. 6, 2015

(65) Prior Publication Data
US 2016/0381801 A1 Dec. 29, 2016

(30) Foreign Application Priority Data

Jan. 28, 2014 (JP) .................................. 2014-013696
Oct. 28, 2014 (JP) .................................. 2014-219705

(51) Int. Cl.
*H05K 7/10* (2006.01)
*H05K 7/12* (2006.01)
(Continued)

(52) U.S. Cl.
CPC ................ *H05K 1/181* (2013.01); *C09J 5/00* (2013.01); *C09J 9/02* (2013.01); *C09J 11/04* (2013.01);
(Continued)

(58) Field of Classification Search
CPC .... C09J 11/04; C09J 201/00; C09J 2203/326; C09J 5/00; C09J 9/02; H01L 2224/83101;
(Continued)

(56) References Cited

U.S. PATENT DOCUMENTS 5,366,140 A * 11/1994 Koskenmaki .......... H05K 3/323
156/241
9,102,851 B2 * 8/2015 Lee ............................ C09J 9/02
(Continued)

FOREIGN PATENT DOCUMENTS

EP          0232127     *  8/1987
JP      H09-320345 A       12/1997
(Continued)

OTHER PUBLICATIONS

Aug. 25, 2016 International Preliminary Report on Patentability issued in International Patent Application No. PCT/JP2015/050620.
(Continued)

*Primary Examiner* — Yuriy Semenenko
(74) *Attorney, Agent, or Firm* — Oliff PLC

(57) ABSTRACT

Ensure conduction between an electronic component and a circuit substrate having reduced pitches in wiring of the circuit substrate or electrodes of the electronic component and prevent short circuits between electrode terminals of the electronic component. A connection body has an electronic component connected to a circuit substrate via an anisotropic conductive adhesive agent; the anisotropic conductive adhesive agent contains a binder resin layer in which conductive particles are regularly arranged; an inter-particle distance among the conductive particles in a space between connection electrodes formed on the electronic component being greater than the inter-particle distance among the
(Continued)

conductive particles trapped between the connection electrodes and substrate electrodes formed on the circuit substrate.

16 Claims, 10 Drawing Sheets

(51) Int. Cl.
| | | |
|---|---|---|
| *H05K 1/18* | (2006.01) | |
| *C09J 9/02* | (2006.01) | |
| *C09J 11/04* | (2006.01) | |
| *C09J 201/00* | (2006.01) | |
| *H01R 4/04* | (2006.01) | |
| *C09J 5/00* | (2006.01) | |
| *H05K 3/32* | (2006.01) | |

(52) U.S. Cl.
CPC .............. *C09J 201/00* (2013.01); *H01R 4/04* (2013.01); *H05K 3/323* (2013.01); *C09J 2203/326* (2013.01); *H01L 2224/83101* (2013.01); *H05K 2201/0203* (2013.01)

(58) Field of Classification Search
CPC .. H01R 4/04; H05K 1/181; H05K 2201/0203; H05K 3/323
See application file for complete search history.

(56) References Cited

U.S. PATENT DOCUMENTS

| | | | | |
|---|---|---|---|---|
| 9,231,133 | B2 * | 1/2016 | Fogel | ................ H01L 31/02366 |
| 9,318,641 | B2 * | 4/2016 | Fogel | .................. H01L 31/1804 |
| 9,475,963 | B2 * | 10/2016 | Liang | .......................... C09J 9/02 |
| 2005/0104225 | A1 * | 5/2005 | Huang | .................... H01L 24/11 |
| | | | | 257/779 |
| 2007/0059503 | A1 * | 3/2007 | Park | ........................ H01B 1/22 |
| | | | | 428/209 |

FOREIGN PATENT DOCUMENTS

| | | | |
|---|---|---|---|
| JP | 2004-214374 | A | 7/2004 |
| JP | 2005-203758 | A | 7/2005 |
| JP | 2007-035743 | A | 2/2007 |
| JP | 2007035743 | * | 2/2007 |
| JP | 2007-165052 | A | 6/2007 |
| JP | 4789738 | B2 | 10/2011 |

OTHER PUBLICATIONS

Mar. 31, 2015 International Search Report issued in International Patent Application No. PCT/JP2015/050620.

* cited by examiner

CONNECTION BODY AND CONNECTION BODY MANUFACTURING METHOD

TECHNICAL FIELD

The present disclosure relates to a connection body and a method for manufacturing a connection body in which an electronic component and a circuit substrate are connected, and more particularly relates to a connection body and a method for manufacturing a connection body in which an electronic component and a circuit substrate are connected via an adhesive agent containing conductive particles. This application claims priority to Japanese Patent Application No. 2014-013696 filed on Jan. 28, 2014 and Japanese Patent Application No. 2014-219705 filed on Oct. 28, 2014, the entire contents of which are hereby incorporated by reference.

BACKGROUND ART

Conventionally, devices such as televisions, PC monitors, mobile phones, smart phones, portable game devices, tablet devices, wearable devices and automotive monitors, among others, have used a liquid crystal display device or an organic EL panel as a display means. In recent years, in such display devices, in view of finer pitches and thinner and lighter devices, mounting of driver ICs directly onto glass substrates of display panels, which is known as COG (chip on glass), has been employed.

For example, in a liquid crystal display panel in which COG mounting is employed, as shown in FIG. 12A and FIG. 12B, a plurality of transparent electrodes 102 made from, among other materials, ITO (indium tin oxide), are formed onto a transparent substrate 101 made from, for example, a glass substrate, and an electronic component such as a liquid crystal driver IC 103 is connected onto these transparent electrodes 102. The liquid crystal driver IC 103 has electrode terminals 104 corresponding to the transparent electrodes 102 formed onto the mounting surface thereof and is thermocompression-bonded onto the transparent substrate 101 via an anisotropic conductive film 105, thereby connecting the electrode terminals 104 to the transparent electrodes 102.

The anisotropic conductive film 105 contains a binder resin into which conductive particles are dispersed and is film-formed, and by being thermocompression-bonded between two conductors, electrical conduction between the conductors is achieved by the conductive particles and mechanical connection between the conductors is ensured between the conductors by the binder resin. The adhesive agent constituting the anisotropic conductive film 105, although typically a highly reliable thermosetting binder resin is used, may be a photosetting binder resin or a thermo/photosetting binder resin.

In the case of connecting the liquid crystal driver IC 103 to the transparent electrodes 102 via such an anisotropic conductive film 105, the anisotropic conductive film 105 is first temporarily bonded onto the transparent electrodes 102 of the transparent substrate 101 by a temporary pressure bonding means which is not illustrated in the drawings. After mounting the liquid crystal driver IC 103 onto the transparent substrate 101 via the anisotropic conductive film 105 to form a temporary connection body, a thermocompression bonding means, for example, a thermocompression bonding head 106, is used to hot-press the liquid crystal driver IC 103 along with the anisotropic conductive film 105 towards the transparent substrate 102. Heat applied by the thermocompression bonding head 106 causes a thermosetting reaction in the anisotropic conductive film 105, thereby connecting the liquid crystal driver IC 103 onto the transparent electrodes 102.

PRIOR ART LITERATURE

Patent Literatures

PLT 1: Japanese Patent No. 4789738
PLT 2: Japanese Unexamined Patent Application Publication No. 2004-214374
PLT 3: Japanese Unexamined Patent Application Publication No. 2005-203758

SUMMARY OF THE INVENTION

Problem to be Solved by the Invention

In recent years, along with size reductions and precision increases in liquid crystal displays and other electronic devices, progress has also been made in making finer pitches for wiring of circuit substrates and electrode terminals of electronic components; in the case of a reduced electrode terminal pitch and using an anisotropic conductive film to COG connect an electronic component such as an IC chip to a circuit substrate, in order to ensure conduction by certainly trapping conductive particles between electrode terminals and substrate electrodes which are narrowed and size-reduced, it has been necessary to fill the conductive particles at a high density.

However, as illustrated in FIG. 13, in progress in finer pitches for wiring pitches of circuit substrates and electrode terminals in electronic components, filling the conductive particles 107 at a high density leads to increases in occurrence rates of inter-terminal short circuits caused by the conductive particles 107 dispersed between the electrode terminals 104 becoming continuous.

It should be noted that, generally, because electrodes formed on circuit substrates are formed by, among other methods, printing at thicknesses in the order of several tens of nanometers to several micrometers, circuit substrate-side inter-electrode short circuits have not been a problem.

Thus, an object of the present disclosure is to provide a connection body and a method for manufacturing a connection body which, even in the case of a reduced pitch in wiring of a circuit board and electrode terminals of an electronic component, can ensure electrical conduction between the electronic component and the circuit substrate and prevent inter-electrode short circuits in the electronic component.

Solution to Problem

In order to solve the aforementioned problems, a connection body according to the present disclosure comprises an electronic component connected onto a circuit substrate via an anisotropic conductive adhesive agent; wherein the anisotropic conductive adhesive agent has a binder resin in which conductive particles are arranged; wherein the conductive particles in a space between connecting electrodes formed on the electronic component have an inter-particle distance with respect to each other that is greater than an inter-particle distance of the conductive particles trapped between substrate electrodes formed on the circuit substrate and the connecting electrodes.

Furthermore, a method for manufacturing a connection body according to the present disclosure comprises: mounting an electronic component onto a circuit substrate via an adhesive agent containing conductive particles; and pressing the electronic component against the circuit substrate and curing the adhesive agent, thereby connecting the electronic component onto the circuit substrate; wherein the anisotropic conductive adhesive has conductive particles arranged in a binder resin; wherein connecting electrodes have a space therebetween in which the conductive particles have an inter-particle distance with respect to each other that is greater than an inter-particle distance of conductive particles which are trapped between substrate electrodes formed on the circuit substrate and the connecting electrodes formed on the electronic component.

Advantageous Effects of Invention

According to the present disclosure, inter-particle distance between respective conductive particles in inter-terminal spaces of adjacent electrode terminals is greater than inter-particle distance between respective conductive particles trapped between connecting electrodes and substrate electrodes. Therefore, inter-terminal short circuits caused by the conductive particles being continuous in inter-terminal spaces of the connecting electrodes having a reduced pitch can be prevented.

DESCRIPTION OF EMBODIMENTS

Figure 1:
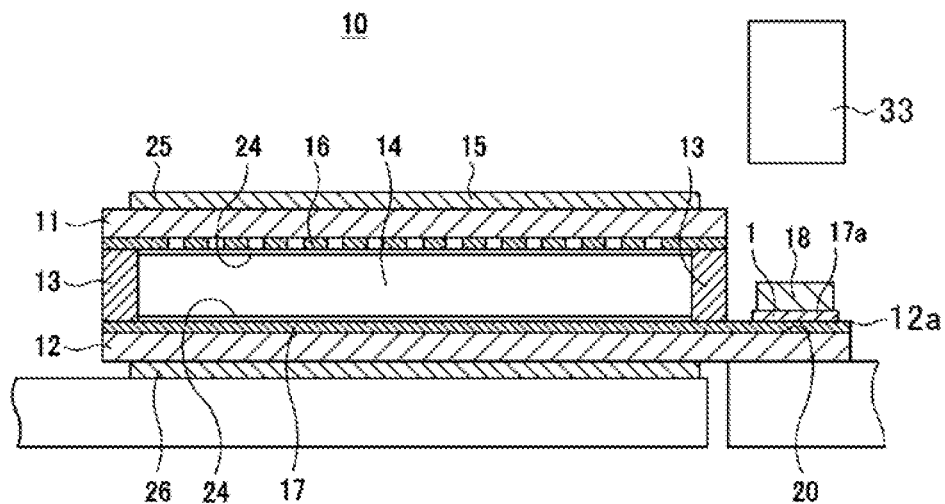
FIG. 1 is a cross-sectional view illustrating one example of a connection body of a liquid crystal display panel.

Hereinbelow, a connection body and a method for manufacturing a connecting body according to the present disclosure will now be more particularly described with reference to the accompanying drawings. It should be noted that the present disclosure is not limited to the embodiments described below and various modifications can be made without departing from the scope of the present invention. The features shown in the drawings are illustrated schematically and are not intended to be drawn to scale. Actual dimensions should be determined in consideration of the following description. Moreover, those skilled in the art will appreciate that dimensional relations and proportions may be different among the drawings in some parts.

Liquid Crystal Display Panel

In the following, a liquid crystal display panel will be described as an example in which, as the connection body according to the present disclosure, a liquid crystal driver IC is mounted as the electronic component onto a glass substrate. As illustrated in FIG. 1, in a liquid crystal display panel 10, two transparent substrates 11, 12 comprising, for example, glass substrates are arranged to face each other and these transparent substrates 11, 12 are joined together by a seal 13 which is frame-shaped. In the liquid crystal display panel 10, a panel display component 15 is formed by sealing a liquid crystal 14 within a space enclosed by the transparent substrates 11, 12.

On both inner surfaces of the transparent substrates 11, 12 opposing each other, a pair of transparent electrodes 16, 17 are formed from, for example, ITO (indium tin oxide) in a stripe pattern in mutually intersecting directions. Both of the transparent electrodes 16, 17 are configured so that a pixel, as the minimum unit of the liquid crystal display, is constituted by intersecting portions of both of the transparent electrodes 16, 17.

Among both of the transparent substrates 11, 12, one transparent substrate 12 is formed to be larger than the other transparent substrate 11 in planar dimensions, in an edge area 12a of the transparent substrate 12 formed to be larger, a COG mounting portion 20 is provided on which a liquid crystal driver IC 18 is mounted as the electronic component. It should be noted that, on the COG mounting portion 20, terminal portions 17a of the transparent electrodes 17 and a substrate-side alignment mark 21, which is to be superimposed with an IC-side alignment mark 22 provided on the liquid crystal driver IC 18, are formed.

Figure 2:
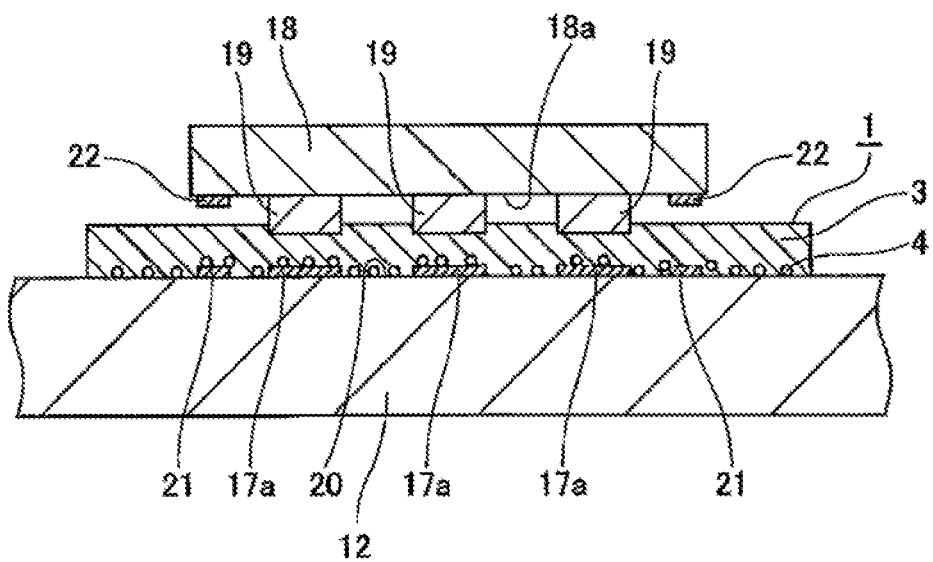
FIG. 2 is a cross-sectional view illustrating a connecting step of a liquid crystal driver IC and a transparent substrate.

The liquid crystal driver IC 18, by selectively applying a liquid crystal driving voltage to the pixel, can partially change liquid crystal orientation to perform a selected liquid crystal display. As illustrated in FIG. 2, the liquid crystal driver IC 18 has a mounting surface 18a which faces the transparent substrate 12 and on which electrode terminals 19 (bumps) are formed for electrically connecting to terminal portions 17a of the transparent substrate 17. Suitable examples usable as the electrode terminals 19 include copper bumps, gold bumps and gold-plated copper bumps, among others.

Electrode Terminal

Figure 3:
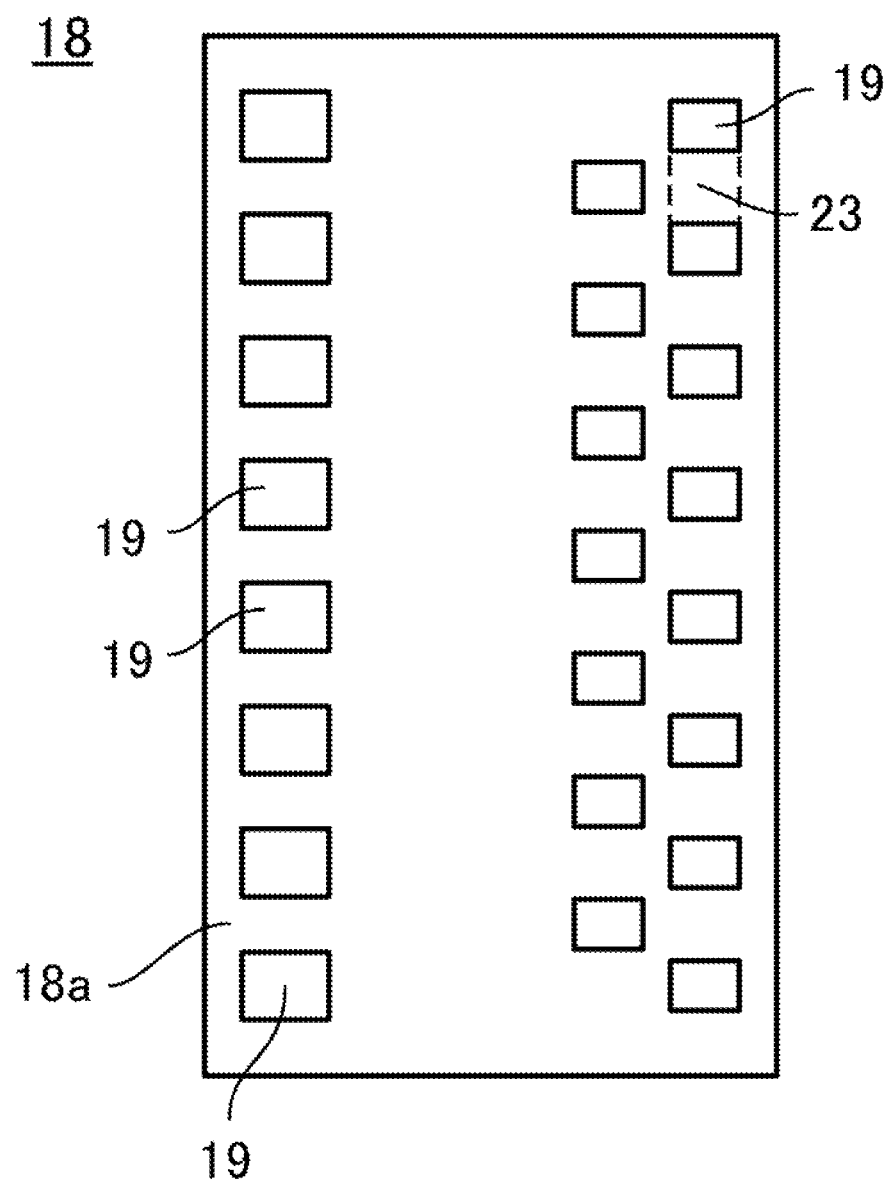
FIG. 3 is a plan view illustrating electrode terminals (bumps) of a liquid crystal driver IC and an inter-terminal space.

In the liquid crystal driver IC 18, for example, as illustrated in FIG. 3, the electrode terminals 19 (input bumps) are arranged in a single line along one edge side of the mounting surface 18a and the electrode terminals 19 (output bumps) are arranged in a staggered fashion in multiple rows along another edge side that is opposite to the one edge side. The transparent electrodes 19 and the terminal portions 17a formed on the COG mounting portion 20 of the transparent substrate 12 are formed in equal number at equal pitch and are connected by positioning and connecting the transparent substrate 12 and the liquid crystal driver IC 18.

It should be noted that, recently, along with size reductions and advanced functionality in liquid crystal displays and other electronic devices, size reductions and height reductions are desired in electronic components such as the liquid crystal driver IC 18 and height of the terminal electrodes 19 is also reduced (to, for example, 6 to 15 t m).

Figure 4:
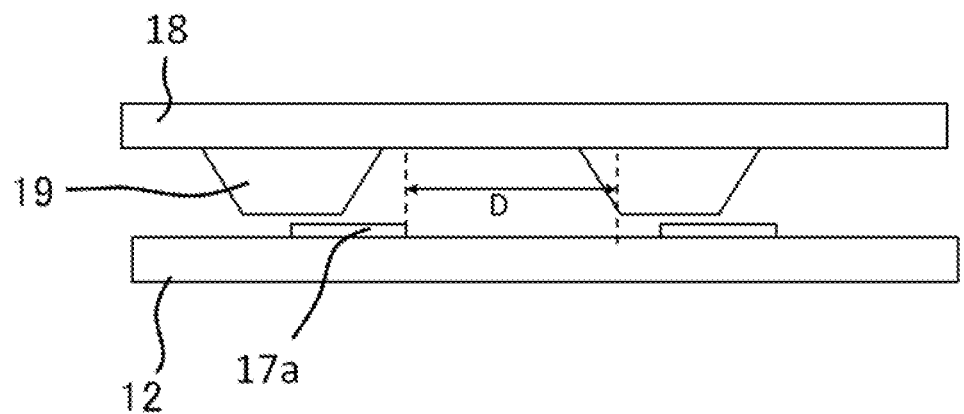
FIG. 4 is a cross-sectional view illustrating a minimum distance D along an arrangement direction of the electrode terminals and the terminal portions in a liquid crystal driver IC and a transparent substrate.

In recent years, as described above, along with size reductions and precision increases in liquid crystal display and other electronic devices, advancements have also been made in finer pitches such as in pitches for circuit substrate wiring and connecting terminals of electronic components. For example, in the liquid crystal driver IC 18, contact surface area of electrode terminals 19 with the terminal portions 17a has a width of 8 to 60 μm and a length of less than 400 μm, the lower limit of the length being equivalent to the width (8 to 60 μm) or less than 7 times the diameter of the conductive particles. Furthermore, the minimum distance between the electrode terminals 19 is, depending on the width of the electrode terminals 19, for example, 8 to 30 μm. Moreover, for example, in a minimum distance D, which may be shifted in an arrangement direction to the extent that anisotropic connection is possible, in regards to the arrangement direction of the electrode terminals 19 and the terminal portions 17a illustrated in FIG. 4, can be less than 4 times the diameter of the conductive particles.

Additionally, as described hereinafter, the liquid crystal driver IC 18, by being mounted onto a COG mounting portion 20 of the transparent substrate 12, flowability of the binder resin of the anisotropic conductive film 1 in the vicinity of the top of the electrode terminal 19 and in the inter-terminal spaces 23 between the electrode terminals 19 is different and flowability in the binder resin is higher in the inter-terminal spaces 23 and flows more easily. Due to this flowability, in the liquid crystal display panel 10, the distance between closest particles (hereinafter also referred to as "inter-particle distance") of the conductive particles 4 in the inter-terminal spaces 23 is greater than that of the conductive particles 4 between the terminal portions 17a and the electrode terminals 19 connected thereto.

Furthermore, on the mounting surface 18a of the liquid crystal driver IC 18, an IC-side alignment mark 22 is formed for performing alignment with respect to the transparent substrate 12 by superimposing with the substrate-side alignment mark 21. It should be noted that, due to progress in finer wiring pitches for the transparent electrodes 17 of the transparent substrate 12 and electrode terminals 19 of the liquid crystal driver IC 18, high accuracy is desired in alignment of the liquid crystal driver IC 18 and the transparent substrate 12.

As the substrate-side alignment mark 21 and the IC-side alignment mark 22, a variety of marks can be used which can be combined together to align the transparent substrate 12 and the liquid crystal driver IC 18.

On the terminal portions 17a of the transparent electrodes 17 formed on the COG mounting portion 20, the liquid crystal driver IC 18 is connected using an anisotropic conductive film 1 as a circuit connecting-use adhesive agent. The anisotropic conductive film 1 contains conductive particles 4 and is for electrically connecting, via the conductive particles 4, the electrode terminals 19 of the liquid crystal driver IC 18 to the terminal portions 17a of the transparent electrodes 17 formed on the edge area 12a of the transparent substrate 12. In the anisotropic conductive film 1, thermo-compression bonding with the thermocompression bonding head 33 causes the binder resin to flow, deforms the conductive particles 4 between the terminal portions 17a and the electrode terminals 19 of the liquid crystal driver IC 18 and cures the binder resin in this state. The anisotropic conductive film 1 thus mechanically and electrically connects the transparent substrate 12 and the liquid crystal driver IC 18.

Further, on both the transparent electrodes 16, 17, an orientation film 24 that is subjected to a predetermined rubbing treatment is formed and an initial orientation of the liquid crystal molecules is regulated by this orientation film 24. Still further, a pair of polarizing plates 25, 26 are disposed on the outer surfaces of the transparent substrates 11, 12; these polarizing plates 25, 26 regulate the wave-direction of transmitted light from a light source such as a backlight (not illustrated).

Anisotropic Conductive Film

Figure 5:
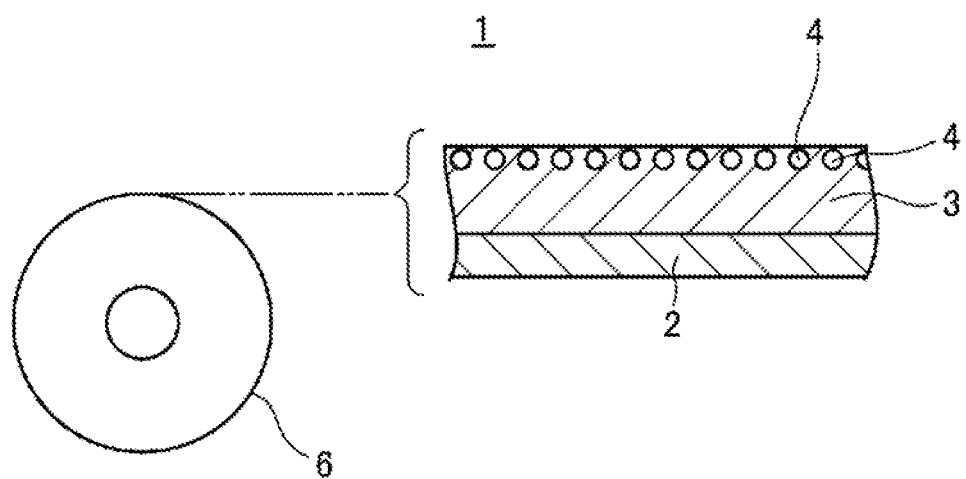
FIG. 5 is a cross-sectional view illustrating an anisotropic conductive film.

Next, the anisotropic conductive film 1 will be described. In the anisotropic conductive film (ACF) 1, as illustrated in FIG. 5, typically, a binder resin layer (adhesive agent layer) 3 containing the conductive particles 4 is formed on a release-treated film 2 serving as a matrix material. The anisotropic conductive film 1 is an adhesive agent of a thermosetting-type or a photocurable-type such as by ultraviolet light and is pasted onto the transparent electrodes 17, which are formed on the transparent substrate 12 of the liquid crystal display panel 10, along with mounting the liquid crystal driver IC 18; flowing is caused by thermo-compression-bonding by the thermocompression bonding head 33 and the conductive particles 4 are deformed between the terminal portions 17a of the respectively opposing transparent electrodes 17 and the electrode terminals 19 of the liquid crystal driver IC 18; heat is then applied or ultraviolet light is irradiated in order to cure the resin in a state in which the conductive particles are deformed. The anisotropic conductive film 1 is thus able to connect and conduct electricity between the transparent substrate 12 and the liquid crystal driver IC 18.

Further, in the anisotropic conductive film 1, in the binder resin layer 3 which contains, as typical, a film-forming resin, a thermosetting resin, a latent curing agent and a silane coupling agent, the conductive particles 4 are regularly arranged in a predetermined pattern.

The release-treated film 2 for supporting the binder resin layer 3 is formed by coating, for example, PET (polyethylene terephthalate), OPP (oriented polypropylene), PMP (poly-4-methylpentene-1), PTFE (polytetrafluoroethylene), among others, with a release agent such as silicone, and is for preventing drying of the anisotropic conductive film 1 and maintaining the shape of the anisotropic conductive film 1.

As the film-forming resin contained by the binder resin layer 3, a resin having an average molecular weight of approximately 10,000 to 80,000 is preferably used. Examples of film forming resin include epoxy resin, modified epoxy resin, urethane resin and phenoxy resin, among a wide variety of other resins. Among these, in view of such properties as resin-formed states and connection reliability, a phenoxy resin is particularly preferable.

Examples of thermosetting resins, without particular limitation, include commercially available epoxy resins and acrylic resins.

Examples of epoxy resin include, without particular limitation, naphthalene-type epoxy resin, biphenol-type epoxy resin, phenol-novolac type epoxy resin, bisphenol type epoxy resin, stilbene-type epoxy resin, triphenolmethane-type epoxy resin, phenol aralkyl-type epoxy resin, naphthol-type epoxy resin, dicyclopentadiene-type epoxy resin and triphenylmethane-type epoxy resin, among others. These may be used individually or in a combination of two or more.

Acrylic resin is without particular limitation and an acrylic compound and/or a liquid acrylate, among others, may be selected as appropriate according to purpose. Examples include methyl acrylate, ethyl acrylate, isopropyl acrylate, isobutyl acrylate, epoxy acrylate, ethylene glycol diacrylate, diethylene glycol diacrylate, trimethylol propane triacrylate, dimethylol tricyclodecane diacrylate, tetramethylene glycol tetraacrylate, 2-hydroxy-1,3-diacryloxy propane, 2,2-bis[4-(acryloxy) phenyl] propane, 2,2-bis[4-(acryloxy ethoxy) phenyl] propane, dicyclopentenyl acrylate, tricyclodecanyl acrylate, tris(acryloxyethyl) isocyanurate, urethane acrylate and epoxy acrylate, among others. It should be noted that methacrylate may be substituted for acrylate. These may be used individually or in a combination of two or more.

The latent curing agent is without particular limitation and examples include thermosetting and UV-curing types, among a variety of other types of curing agents. The latent curing agent does not react under normal conditions and a trigger including heat, light and/or pressure, among others, for activation/initiating a reaction can be selected according to need. Existing methods for activating a heat activated latent curing agent include methods in which active species (cations, anions and/or radicals) are generated by a dissociative reaction due to heat, methods in which the curing agent is stably dispersed in the epoxy resin, the curing agent becomes compatible with and dissolves in the epoxy resin at high temperatures and the curing reaction is initiated, methods in which a molecular sieve enclosed type curing agent is dissolved at a high temperature to initiate the curing reaction and methods in which microcapsules are dissolved to cure, among other methods. Examples of latent curing agents include imidazole-type, hydrazide-type, boron trifluoride-amine complexes, sulfonium salt, aminimide, polyamine salt and dicyandiamide, among others, and modified compounds of these; these may be used individually or in a combination of two or more. Among these, a microcapsule imidazole-type latent curing agent is particularly suitable.

The silane coupling agent is without particular limitation and examples include epoxy-type, amino-type, mercapto/sulfide-type, and ureido-type, among others. By adding the silane coupling agent, adhesion properties at interfaces between organic and inorganic materials can be improved.

Conductive Particles

Examples of conductive particles 4 usable in the anisotropic conductive film 1 include known conductive particles used in anisotropic conductive films. As the conductive particles 4, examples include particles of metals or metal alloys such as those of nickel, iron, copper, aluminum, tin, lead, chromium, cobalt, silver or gold and particles such as those of metal oxides, carbon, graphite, glass, ceramics and plastics coated with metal, or the above-mentioned particles further coated with a thin electrically-insulating film, among others. In the case of coating a metal to the surface of resin particles, examples of usable resin particles include phenol resin, acrylic resin, acrylonitrile-styrene (AS) resin, benzoguanamine resin, divinylbenzene-type resin and styrene-type resin particles, among others. Size of the conductive particles 4 is preferably 1 to 10 μm; however, the present disclosure is not limited to this range.

Regular Arrangement of Conductive Particles

Figure 6:
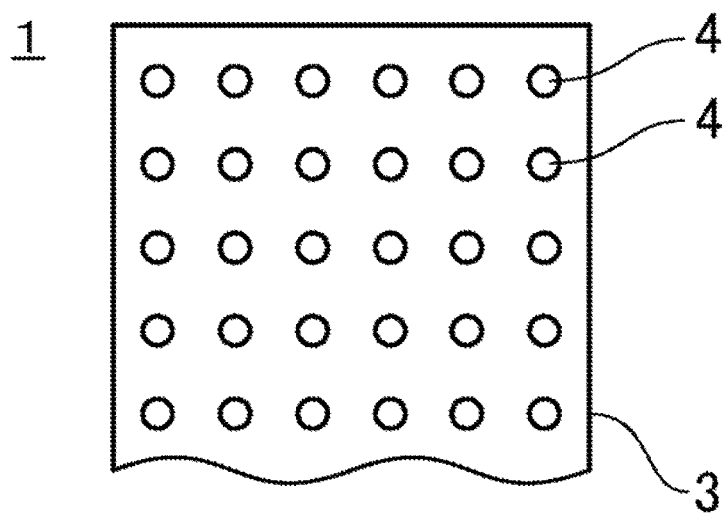
FIG. 6 is a plan view illustrating an anisotropic conductive film in which conductive particles are regularly arranged in a grid pattern.

In the anisotropic conductive film 1, the conductive particles 4 are arranged in a predetermined regular pattern as viewed from a planar perspective, for example as illustrated in FIG. 6, in a uniformly spaced grid. By regularly arranging the conductive particles 4, in contrast with the case of randomly dispersing the conductive particles 4, even in the case of a reduced pitch between adjacent terminals, a reduced and narrowed inter-electrode surface area for the electrode terminals 19 of the liquid crystal driver IC 18, and the conductive particles 4 being filled at a high density, in the connecting step of the liquid crystal driver IC 18, the anisotropic conductive film 1 can prevent short circuits between the electrode terminals 19 caused by agglomeration of the conductive particles 4.

Further, regularly arranging the conductive particles 4 in the anisotropic conductive film 1 prevents unevenness in density due to agglomeration of the conductive particles 4, even in the case of filling the binder resin layer 3 at a high density. Therefore, with the anisotropic conductive film 1, the conductive particles 4 can be trapped even in the case of the terminal portions 17a and the electrode terminals 19 having reduced pitches. The uniformly spaced pattern arrangement of the conductive particles 4 can be arbitrarily selected. The connecting step of the liquid crystal driver IC 18 is described in detail further below.

Such an anisotropic conductive film 1 can be manufactured by methods including, for example, methods of coating a pressure-sensitive adhesive agent onto a stretchable sheet and arranging the conductive particles 4 in a single layer before stretching the sheet to a selected draw ratio, methods of adjusting the conductive particles 4 into a selected pattern on a matrix material and subsequently transferring the conductive particles 4 to the binder resin layer 3 which is supported by the release-treated film, and methods of supplying the conductive particles 4 via an arrangement plate having openings corresponding to the pattern, among other methods.

Particle Number Density

It should be noted that, due to progress in finer pitches for wiring of the transparent electrodes 17 of the transparent substrate 12 and electrode terminals 19 of the liquid crystal driver IC 18, in the case of COG connecting the liquid crystal driver IC 18 onto the transparent substrate 12, in order to ensure conduction by ensuring sandwiching of the conductive particles 4 between the electrode terminals 19 and the terminal portions 17a having a finer pitch, the conductive particles 4 are arranged at a high density in the anisotropic conductive film 1.

For example, in the anisotropic conductive film 1 a, the conductive particles 4 are arranged at a number density of 5,000 to 60,000 particles/mm$^2$. In the case of the particle number density being less than 5,000 particles/mm$^2$, the number of particles trapped between the electrode terminals 19 and the terminal portions 17a is reduced and electrical resistance is increased. Furthermore, in the case of the particle number density being more than 60,000 particles/mm$^2$, particles might become continuous within the size-reduced and narrowed inter-terminal space 23 between the electrode terminals 19 and cause short circuits between adjacent electrode terminals 19. It should be noted that these are few examples to which the present disclosure is not limited, and the number density of the conductive particles 4 can be arbitrarily adjusted according to size of the conductive particles 4.

It should be noted that the shape of the anisotropic conductive film 1 is without particular limitation, and, for example, as illustrated in FIG. 5, can be a long, tape shape windable around a winding reel 6 that can be used by simply cutting to a selected length.

In the embodiment described above, as an example, as the anisotropic conductive film 1, a film-formed adhesive film made from a thermosetting resin composition containing the binder resin layer 3 in which the conductive particles 4 were dispersed is described; however, the adhesive agent according to the present disclosure is not limited thereto, and, for example, a configuration is possible in which an insulating adhesive agent layer containing the binder resin 3 alone is laminated with a conductive particle-containing layer containing the binder resin 3 which contains the conductive particles 4 in a regular arrangement. Furthermore, in the anisotropic conductive film 1, in the case of regularly arranging the conductive particles 4 as viewed from a planar perspective, in addition to being arranged in a single layer as illustrated in FIG. 5, the conductive particles 4 may be regularly arranged as viewed from a planar perspective in a plurality of binder resin layers 3. Still further, in at least one layer of a multilayer structure of the anisotropic conductive film 1, the conductive particles 4 may be dispersed at a single, selected distance.

Connecting Step

A connecting step for connecting the liquid crystal driver IC 18 to the transparent substrate 12 will now be described in detail. First, the anisotropic conductive film 1 is temporarily pasted onto the COG mounting portion 20 having the terminal portions 17a of the transparent substrate 12 formed thereon. Next, the transparent substrate 12 is placed on a stage of a connecting device and the liquid crystal driver IC 18 is positioned on the transparent substrate 12 with the anisotropic conductive film 1 interposing therebetween.

Next, by using a thermocompression head 33 heated to a predetermined temperature for curing the binder resin layer 3 at a predetermined pressure and time, the liquid crystal driver IC 18 is thermocompression-bonded from above. The binder resin layer 3 of the anisotropic conductive film 1 thus exhibits flowability, and, while the binder resin layer 3 flows from between the mounting surface 18a of the liquid crystal driver IC 18 and the COG mounting portion 20 of the transparent substrate 12, the conductive particles 4 within the binder resin layer 3 are sandwiched and deformed between the electrode terminals 19 of the electrode terminals 18 and the terminal portions 17a of the transparent substrate 12.

Consequently, the electrode terminals 19 and the terminal portions 17a are electrically connected by the conductive particles 4 being sandwiched therebetween and, in this state, heat is applied by a thermocompression head 33 to cure the binder resin. This enables manufacturing of the liquid crystal display panel 10 in which conduction is ensured between the electrode terminals 19 of the liquid crystal driver IC 18 and the terminal portions 17a of the transparent substrate 12.

The conductive particles 4 which are not between the electrode terminals 19 and the terminal portions 17a are dispersed within the binder resin in inter-terminal spaces 23 between adjacent electrode terminals 19 and maintained in an electrically insulated state. Thus, electrical conduction only between the electrode terminals 19 of the liquid crystal driver IC 18 and the terminal portions 17a of the transparent substrate 12 is achievable. It should be noted that, as the binder resin, by using a fast curing type radical polymerization-reaction type, it is possible to rapidly cure the binder resin with a short heating time. Additionally, the anisotropic conductive film 1 is not limited to thermosetting types and as long as pressure can be used in connection, a photosetting type or a thermo/photosetting type adhesive agent can be used.

Inter-Particle Distance Between Conductive Particles

In the present disclosure, inter-particle distance between respective conductive particles 4 in inter-terminal spaces 23 between adjacent electrode terminals 19 is greater than inter-particle distance between respective conductive particles 4 trapped between the electrode terminals 19 and the terminal portions 17a. Therefore, in the liquid crystal display panel 10, inter-terminal short circuits, which are caused by the conductive particles 4 being continuous in the inter-terminal spaces 23 of the electrode terminals 19 having a reduced pitch, can be prevented.

Thus, in the present disclosure, the conductive particles 4 of the anisotropic conductive film 1 are regularly arranged. Furthermore, at the time of thermocompression bonding with the thermocompression head 33, the binder resin has a higher flowability and flows more easily in the inter-terminal spaces 23 than in the vicinity of the tops of the electrode terminal 19 of the liquid crystal driver IC 18. Moreover, the conductive particles 4 trapped between the electrode terminals 19 and the terminal portions 17a receive a small effect from flow of the binder resin.

In contrast, the conductive particles 4 in the inter-terminal spaces 23 which are not sandwiched between the electrode terminals 19 and the terminal portions 17a receive a relatively larger effect from the binder resin which flows due to being thermally compressed by the thermocompression head 33. Consequently, inter-particle distance of the conductive particles 4 in the inter-terminal spaces 23 is relatively large. Thus, in the liquid crystal display panel 10, it is possible to ensure trapping of the conductive particles 4 and conduction between the electrode terminals 19 and the terminal portions 17a; furthermore, inter-particle distance of the conductive particles 4 is maintained in the inter-terminal spaces 23 between the electrode terminals 19 in adjacency, thus enabling prevention of short circuits between the electrode terminals 19.

As previously described, the number density of the conductive particles is preferably 5,000 to 60,000 mm/mm$^2$. By having this number density, in the liquid crystal display panel 10, in addition to preventing short circuits caused by the conductive particles 4 becoming continuous in the inter-terminal spaces 23 which are narrowed, capture of the conductive particles 4 is ensured between the electrode terminals 19 and the terminal portions 17a having finer pitches, enabling improvements in conduction.

Figure 7:
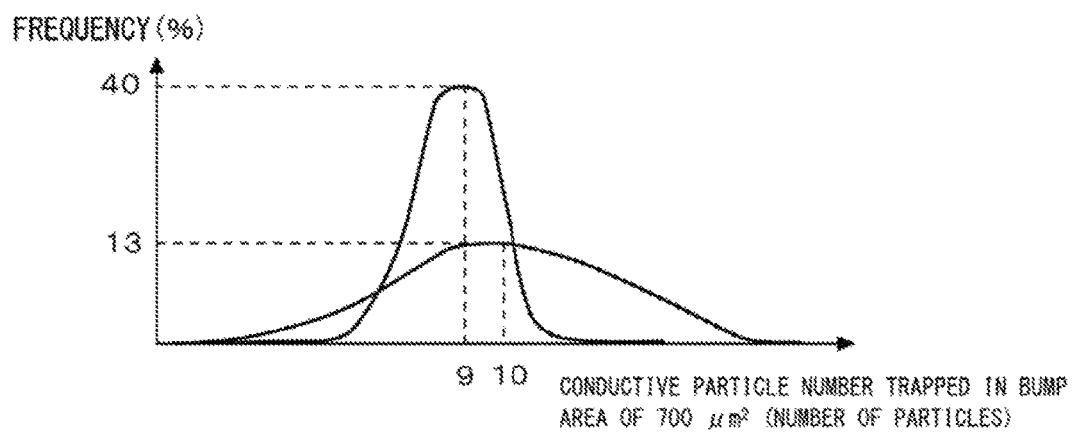
FIG. 7 is a graph representing a distribution of numbers of trapped particles in electrode terminals with respect to an anisotropic conductive film in which conductive particles are regularly arranged and an anisotropic conductive film in which conductive particles are randomly dispersed.

FIG. 7 is a graph comparing distributions of numbers of trapped conductive particles for one electrode terminal 19 in a connection body which had an anisotropic conductive connection which used, in each case, an anisotropic conductive film 1 which had conductive particles that were regularly arranged (number density: 28,000 particles/mm$^2$) and an anisotropic conductive film which had conductive particles that were randomly dispersed (number density: 60,000 particles/mm$^2$). In the above measurements, size of the electrode terminals 19 was 14 µm×50 µm (=700 µm$^2$) and distance between the electrode terminals 19 was 14 µm. Furthermore, the binder and the connection conditions for the anisotropic conductive film 1 was in accordance with the following Examples and Comparative Examples.

As illustrated in FIG. 7 it can be seen that, in a connection body manufactured by using the anisotropic conductive film 1, reliability of trapping is improved.

Film Length Direction Sparse/Dense Arrangement.

Figure 8A:
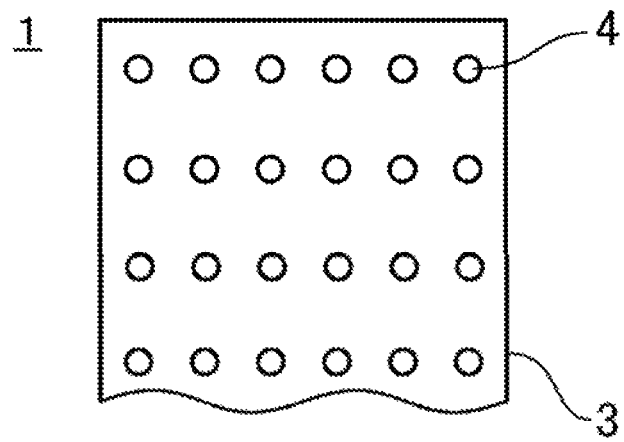
FIG. 8A. is a plan view illustrating an anisotropic conductive film in which conductive particles are arranged sparsely in the length direction and densely in the width direction

As illustrated in FIG. 8A, the anisotropic conductive film 1 is film-formed with the length direction to be in alignment with the arrangement direction of the terminal portions 17a and the electrode terminals 19; the conductive particles 4 may be arranged sparsely across the length direction and densely across the width direction.

The anisotropic conductive film 1 is pasted so that the length distance is aligned with the arrangement direction of the terminal portions 17a and the electrode terminals 19. Thus, the anisotropic conductive film 1, by being pasted onto the COG mounting portion 20, has the conductive particles 4 sparsely arranged across the arrangement direction of the terminal portions 17a and the electrode terminals 19 and densely arranged in the length direction of the terminal portions 17a and the electrode terminals 19.

In such an anisotropic conductive film 1, by arranging the conductive particles 4 to be sparse across the arrangement direction of the terminal portions 17a and the electrode terminals 19, the number of the conductive particles 4 is reduced in inter-terminal spaces 23 between the electrode terminals 19 in adjacency and inter-particle distance is increased, thereby enabling improvements in preventing short circuits between the electrode terminals 19.

Moreover, in the anisotropic conductive film 1, because the conductive particles 4 are densely arranged in the width direction, the particle trapping rate of the conductive particles 4 trapped between the terminal portions 17a and the electrode terminals 19 is increased. Therefore, conduction with the liquid crystal driver IC 18 is not impaired.

Figure 8B:
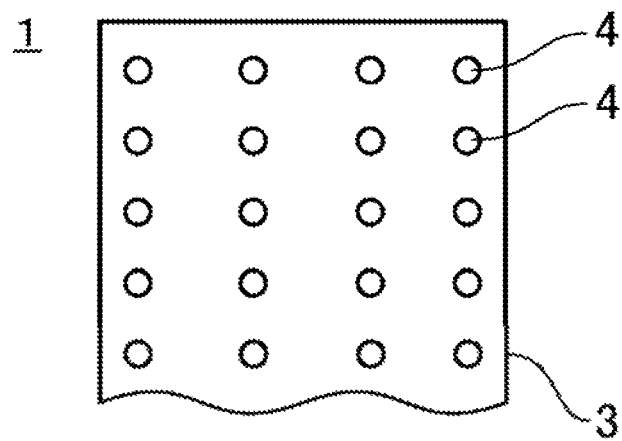
FIG. 8B is a plan view illustrating an anisotropic conductive film in which the conductive particles are arranged densely in the length direction and sparsely in the width direction.

As illustrated in FIG. 8B, the anisotropic conductive film 1 is film-formed with the length direction to be in alignment with the arrangement direction of the terminal portions 17a and the electrode terminals 19; the conductive particles 4 may be arranged densely across the length direction and sparsely across the width direction.

In this case as well, the conductive particles 4 in the inter-terminal spaces 23 are significantly affected by flowing of the binder resin caused by thermocompression applied by thermocompression head 33, and inter-particle distance is relatively large. Consequently, in the liquid crystal display panel 10, short circuits between the electrode terminals 19 can be prevented.

Moreover, in the liquid crystal display panel 10, because the conductive particles 4 are relatively dense in the length direction of the film, trapping of the conductive particles 4 between the terminal portions 17a and the electrode terminals 19 can be ensured, and impairments of electrical conduction with the liquid crystal driver IC 18 can be avoided.

High Density Filling Arrangement

Figure 9:
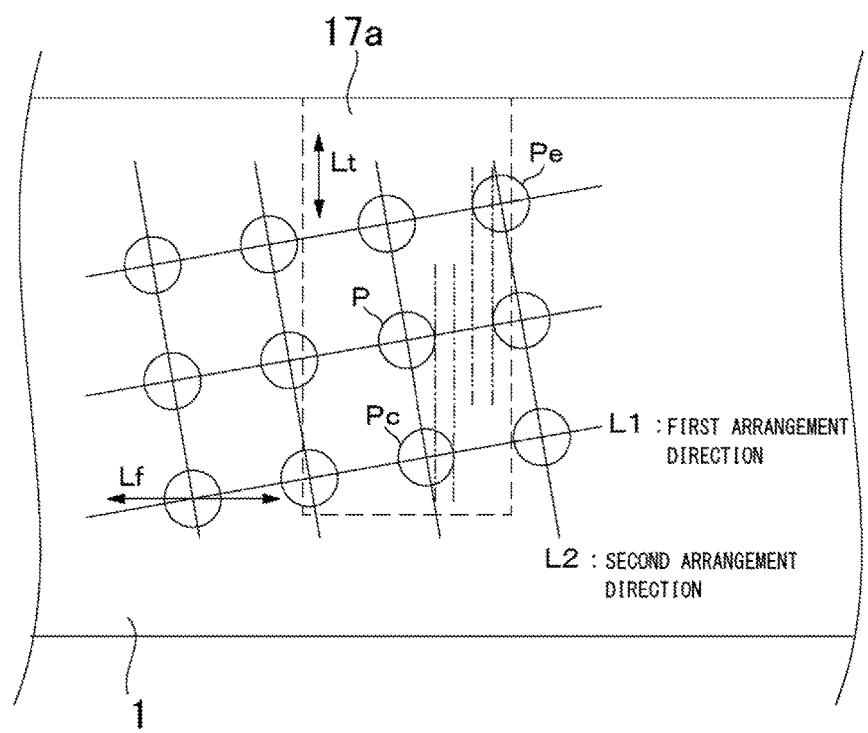
FIG. 9 is a plan view illustrating an anisotropic conductive film in which conductive particles are arranged so as to be at an angle with respect to film length and width directions in a state in which the anisotropic conductive film is arranged on a terminal portion with the film length direction being aligned with the arrangement direction of the terminal portions.
Figure 10:
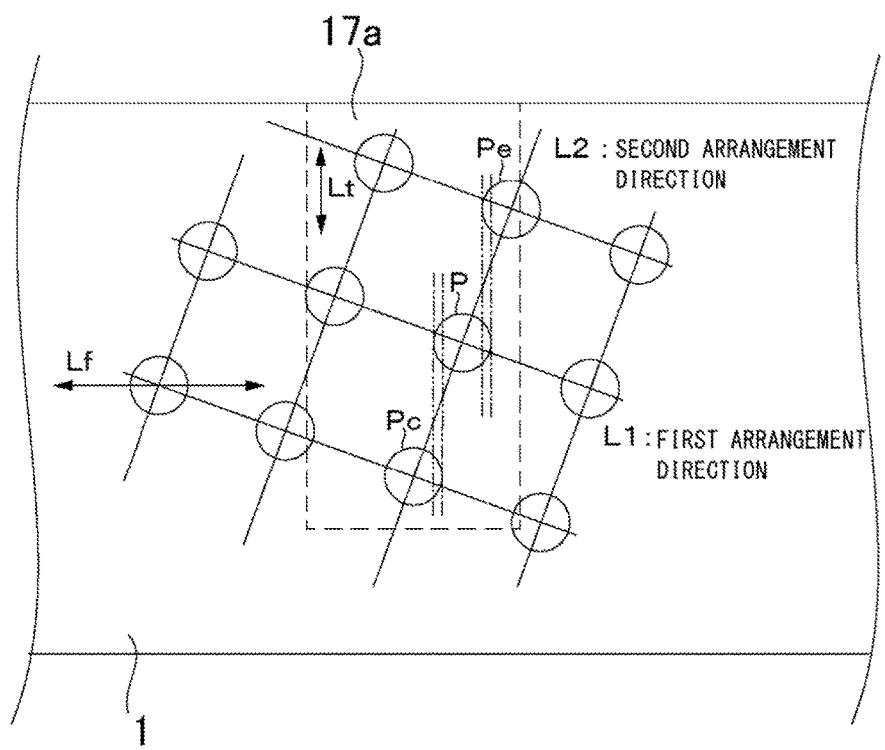
FIG. 10 is a plan view illustrating another anisotropic conductive film in which conductive particles are arranged so as to be at an angle with respect to film length and width directions in a state in which the anisotropic conductive film is arranged on a terminal portion film with the film length direction being aligned with the arrangement direction of the terminal portions.
Figure 11:
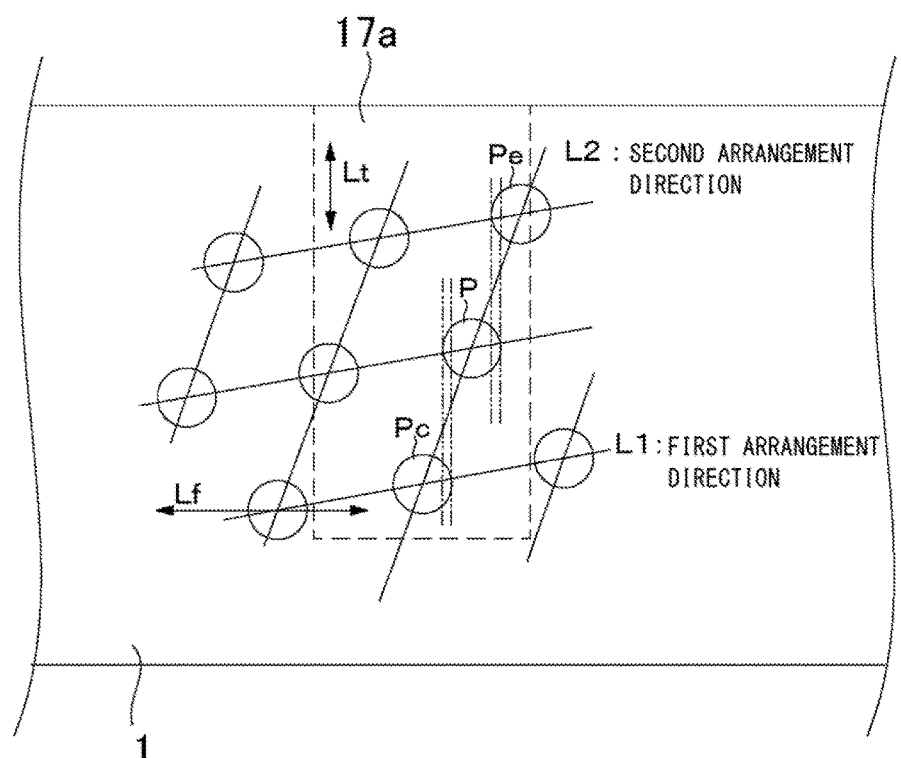
FIG. 11 is a plan view illustrating yet another anisotropic conductive film in which conductive particles are arranged so as to be at an angle with respect to film length and width directions in a state in which the anisotropic conductive film is arranged on a terminal portion with the film length direction being aligned with the arrangement direction of the terminal portions.
Figure 12A:
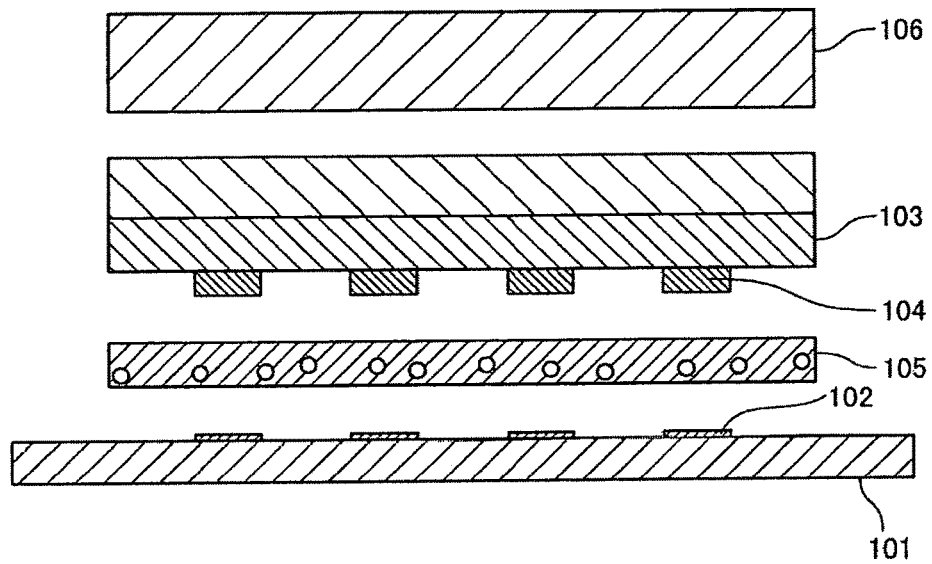
FIG. 12 is a cross sectional view illustrating a process in which an IC chip is connected to a transparent substrate of a liquid crystal display panel in FIG. 12A the process before connection and FIG. 12B the process during connection.
Figure 12B:
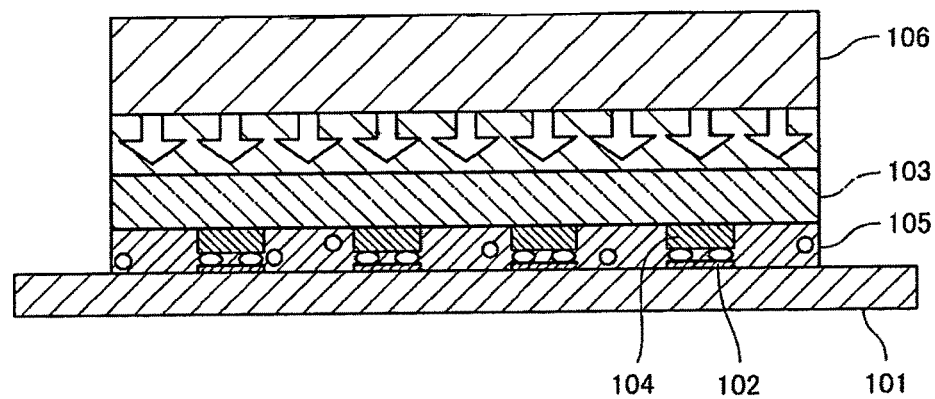
Figure 13:
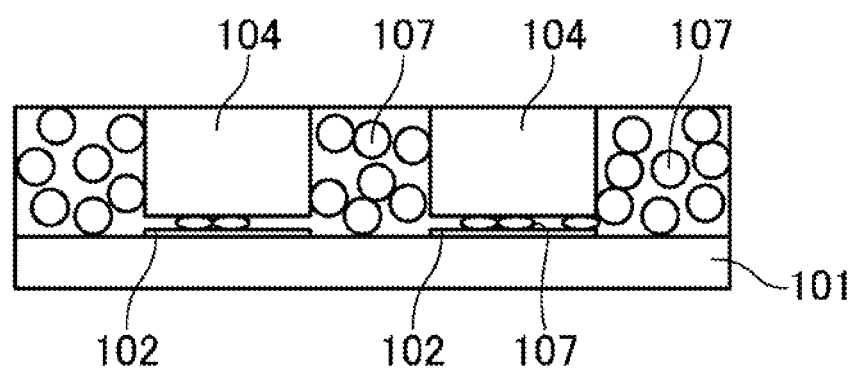
FIG. 13 is a cross sectional view illustrating a connected state of a conventional transparent substrate and IC chip.

As illustrated in FIGS. 9 to 11, in the anisotropic conductive film 1, the conductive particles 4 may be arranged at an angle with respect to a film length direction Lf and a film width direction Lt orthogonal thereto; the film length direction Lf of the film is parallel with an arrangement direction of the terminal portions 17a and the film width direction Lt is parallel with the length direction of the terminal portions 17a; thus, an external tangent line (illustrated by a long dashed double-dotted line) of a conductive particle P, which is orthogonal to the film length direction Lf of the anisotropic conductive film 1 may intersect with adjacent conductive particles Pc, Pe.

Thus, as viewed from a planar perspective in which the anisotropic conductive film 1 is superimposed over the terminal portions 17a of the transparent electrodes 17, inter-particle distances are such that the conductive particles 4 arranged in adjacency are dense in the width direction of the terminal portion 17a (the length direction Lf of the film), thus improving the particle trapping rate of the conductive particles 4 occupying the connection surface of the terminal portion 17a having a reduced pitch. Therefore, at the time of anisotropic conductive connection, the anisotropic conductive film 1 is sandwiched between the electrode terminals 19 and pressed against the terminal portions 17a, the number of the conductive particles P enabling electrical conduction between the substrate terminals 19 and the terminal portions 17a can be prevented from being insufficient.

It should be noted that, in the anisotropic conductive film 1 illustrated in FIGS. 9 to 11, conductive particles are arranged in a second arrangement direction L2 extending in the film width direction Lt at an angle with the film width direction Lt, and a first arrangement direction L1 extending in the film length direction Lf at an angle with the length direction Lf of the film; inter-particle distances are thereby such that the conductive particles 4 arranged in adjacency are dense in the width direction and the length direction of the terminal portion 17a, thus improving the particle trapping rate.

EXAMPLES

Examples of the present disclosure will now be described. In the present examples, anisotropic conductive films in which conductive particles were regularly arranged and anisotropic conductive films in which conductive particles were randomly arranged were used to manufacture sample connecting bodies in which an evaluation-use IC was connected to an evaluation-use glass substrate; between each of the substrate electrodes formed on the evaluation-use glass substrate and IC bumps formed on the evaluation-use IC, the numbers of trapped conductive particles and the minimum distances between conductive particles (inter-particle distances) were measured; furthermore, the numbers of conductive particles and the minimum distances between closest conductive particles (inter-particle distances) in inter-bump spaces between the IC bumps were measured; moreover, initial electrical resistances and inter-bump short circuit occurrence rates between the adjacent IC bumps were measured.

Anisotropic Conductive Film

In the binder resin layer of the anisotropic conductive film used to connect the evaluation-use IC, 60 pts. mass of a phenoxy resin (trade name: YP-50, manufactured by NIPPON STEEL & SUMIKIN CHEMICAL CO., LTD.), 40 pts mass of an epoxy resin (trade name: jER828, manufactured by Mitsubishi Chemical Corporation) and 2 pts. mass of a cation-type curing agent (trade name: SI-60L, manufactured by SANSHIN CHEMICAL INDUSTRY CO., LTD.) were added to a solvent to prepare a binder resin composition, this binder resin composition was applied to a release-treated film and baked.

Evaluation-Use IC

As an evaluation device, an evaluation-use IC was used; outer dimensions: 1.8×20 mm, thickness of 0.5 mm; bumps (Au-plated) width 30 μm, length 85 μm, height 15 μm, inter-bump space: 50 μm.

Evaluation-Use Glass Substrate

As an evaluation-use glass substrate to which the evaluation-use IC was connected, a glass was used which had outer dimensions of 30×50 mm and a thickness of 0.5 mm and an ITO pattern formed in a comb-like shape thereon at a size and pitch equivalent to the bumps on the evaluation-use IC.

The anisotropic conductive films were temporarily pasted to the evaluation-use glass substrates before mounting the evaluation-use ICs while keeping alignment between the IC bumps and the substrate electrodes; by thermocompression-bonding with a thermocompression head under conditions of 180° C., 80 MPa and 5 seconds, connection body samples were manufactured. For each of the connection body samples, numbers and inter-particle distances of trapped conductive particles between the IC bumps and the substrate electrodes, numbers and inter-particle distances of conductive particles in inter-bump spaces between adjacent IC bumps, initial electrical resistance, and the short circuit occurrence rate between adjacent IC bumps were measured.

In measuring the numbers of the conductive particles sandwiched between the IC bumps and the substrate electrodes, for each of the samples, impressions appearing in the substrate electrodes were observed from the back surface of the evaluation-use glass substrate, the number of conductive particles trapped between one pair of the IC bumps and the substrate electrodes was counted for 100 arbitrarily chosen pairs of the IC bumps and the substrate electrodes from which the average was calculated. Similarly, in measuring inter-particle distances of the conductive particles trapped between the IC bumps and the substrate electrodes, impressions appearing in the substrate electrodes were observed from the back surface of the evaluation-use glass substrate, 100 arbitrarily chosen pairs of the IC bumps were measured to find the average and minimum inter-particle distances.

For each connection body sample, 100 arbitrarily chosen inter-bump spaces were observed from the back surface of the evaluation-use glass substrate to take measurements to calculate the averages of particles existing in inter-bump spaces. Similarly, in the inter-particle distances of the conductive particles in the inter-bump spaces, 100 arbitrarily chosen inter-bump spaces were observed from the back surface of the evaluation-use glass substrate to take measurements to find the average and minimum inter-particle distances. It should be noted that the number of conductive particles offset in the depth direction as observed from a planar perspective was approximated from the measured values.

Moreover, for each of the sample connection bodies, an initial resistance of 0.5Ω or less and an inter-IC bump short circuit occurrence rate of 50 ppm or less were evaluated as good.

Example 1

In Example 1, an anisotropic conductive film was used in which conductive particles were regularly arranged in the binder resin layer. The anisotropic conductive film used in Example 1 was manufactured by coating a pressure-sensitive adhesive agent onto a stretchable sheet and arranging the conductive particles in a single layer thereon before stretching the sheet to a selected draw ratio and, in this state, laminating the binder resin layer. Conductive particles (trade name: AUL704, manufactured by Sekisui Chemical Co., Ltd.) having a diameter of 4 μm were arranged at a pre-connection inter-particle distance of 0.5 μm and at a particle number density of 28,000 particles/mm$^2$.

Example 2

Example 2 used an anisotropic conductive film in which pre-connection inter-particle distance was 1 μm, particle number density was 16,000 particles/mm$^2$ with other conditions being the same as in Example 1.

Example 3

Example 3 used an anisotropic conductive film in which pre-connection inter-particle distance was 1.5 μm, particle number density was 10,500 particles/mm$^2$ with other conditions being the same as in Example 1.

Example 4

Example 4 used an anisotropic conductive film in which pre-connection inter-particle distance was 3 μm, particle number density was 5,200 particles/mm$^2$ with other conditions being the same as in Example 1.

Example 5

Example 5 used an anisotropic conductive film in which pre-connection inter-particle distance was 0.5 μm, particle number density was 50,000 particles/mm$^2$ with other conditions being the same as in Example 1.

Comparative Example 1

In Comparative Example 1, conductive particles were dispersed in the binder resin composition and this was applied to a release-treated film and baked to obtain an anisotropic conductive film in which the conductive particles were randomly arranged. Conductive particles (trade name: AUL704, manufactured by Sekisui Chemical Co., Ltd.) having a diameter of 4 μm were used at a particle number density of 100,000 particles/mm$^2$.

Comparative Example 2

In Comparative Example 2, the particle number density was 16,000 particles/mm$^2$ with other conditions being the same as in Comparative Example 1.

TABLE 1

|  |  | Ex. 1 | Ex. 2 | Ex. 3 | Ex. 4 | Ex. 5 | Comp. 1 | Comp. 2 |
|---|---|---|---|---|---|---|---|---|
| Particle Number density (Particles/mm$^2$) | | 28000 | 18000 | 10500 | 5200 | 50000 | 100000 | 16000 |
| Conductive Particle Diameter (μm) | | 4 | 4 | 4 | 4 | 4 | 3 | 4 |
| Conductive Particle Arrangement | | Uniform | Uniform | Uniform | Uniform | Uniform | Random | Random |
| Particles Trapped Within Bump Area | Particles (Ave Particles) | 66.7 | 37.4 | 23.2 | 8.1 | 115.3 | 48 | 7.7 |
| | Inter-Particle AVE: μm | 1.5 | 3.2 | 5.1 | 10.7 | 1.2 | 0.5 | 2.1 |
| | Distance MIN. μm | 0.2 | 2.6 | 4.5 | 9.7 | 1.0 | 0 | 0 |
| Inter-bump Space Particles | Particles (Ave Particles) | 110.5 | 62.4 | 38.8 | 14.3 | 194.2 | 80 | 12.8 |
| | Inter-Particle AVE: μm | 1.8 | 3.8 | 5.8 | 11.2 | 1.4 | 0.7 | 2.6 |
| | Distance MIN: μm | 0.3 | 3.1 | 4.8 | 10.5 | 1.1 | 0 | 0 |
| Electrical Resistance (Ω) | | 0.2 | 0.2 | 0.3 | 0.4 | 0.2 | 0.2 | 5.0 |
| Short Occurrence Rate (ppm) | | 50 or less | 50 or less | 40 or less | 30 or less | 50 or less | 1000 or more | 50 or less |

In Comparative Example 2, the particle number density was 16,000 particles/mm$^2$ with other conditions being the same as in Comparative Example 1. As represented in table 1, in the connection body samples of Examples 1 to 5, the average number of conductive particles trapped between each evaluation-use IC bump and each evaluation-use glass substrate electrode was at least 8.1 and initial electrical resistance was 0.4Ω or less so that a favorable result was achieved. Inter-particle distance of the conductive particles sandwiched between a pair of the IC bumps and the substrate electrodes had an average of 1.2 μm or more and a minimum of 0.2 μm or more.

Moreover, in the connection body samples of Examples 1 to 5, the average numbers of particles in inter-bump spaces between IC bumps in adjacency was 14.3 to 194.2 such that there was variance; however, inter-particle distances had an average of 1.4 μm or more and a minimum of 0.3 μm such that the inter-IC bump short occurrence rate was low at 50 ppm or less and insulating properties were favorable.

In Comparative Example 1, because the conductive particles were randomly dispersed in the binder resin layer and filled at a number density of 100,000 particles/mm$^2$, the number average of particles sandwiched between the substrate electrodes and the IC bumps was 48 particles, inter-panicle distance had an average of 0.5 μm and a minimum distance of 0 μm and initial electrical resistance was 0.2Ω, which was not problematic. However, in inter-bump spaces, number average of the conductive particles was 80 particles, inter-particle distance had an average of 0.7 μm and a minimum distance of 0 μm; thus the conductive particles were in contact with one another such that the inter-bump short circuit occurrence rate was 1,000 ppm or more.

Moreover, in Comparative Example 2, because the conductive particles were randomly dispersed in the binder resin layer and filled at a number density of 16,000 particles/mm$^2$, in inter-bump spaces, the conductive particles had a number average of 12.8 particles and inter-particle distance had an average of 2.6 μm and a minimum of 0 μm such that the conductive particles were in contact with one another; however, the inter-bump short circuit occurrence rate was 50 ppm or less. However, number average of the conductive particles sandwiched between the substrate electrodes and the IC bump was 7.7 μm and inter-particle distance had an average of 2.1 μm and a minimum of 0 μm such that electrical resistance was high at 5Ω.

It should be noted that, in Example 4, although the number density of the conductive particles was 5,000 particles/mm$^2$, the electrical resistance was 0.4Ω, which did not represent a practical problem since the border for defects is a resistance of 0.5Ω. Furthermore, in Example 5, although the number density of the conductive particles was 50,000 particles/mm$^2$, the inter-bump short circuit occurrence rate was at most 50 ppm, which did not represent a practical problem since the border for defects is a rate of 50 ppm. Thus, the number density of the conductive particles in the anisotropic conductive film can be understood to be preferably from 5,000 to 60,000 particles/mm$^2$.

It should be noted that in the case of counting particle numbers of the trapped conductive particles on bumps from impressions, observation is generally performed form the substrate side as described above. At this time, few conductive particles in inter-bump spaces are present in the same plane as the particles trapped in the bumps. This effect is presumably due to the flow.

REFERENCE SIGNS LIST 1 anisotropic conductive film, 2 release-treated film, 3 binder resin layer, 4 conductive particles, 6 winding reel, 10 liquid crystal display panel, 11, 12 transparent substrates, 12a edge area, 13 seal, 14 liquid crystal, 15 panel display unit, 16, 17 transparent electrodes, 17a terminal portions. 18 liquid crystal driver IC, 18a mounting surface, 19 electrode terminals, 20 COG mounting portion, 21 substrate-side alignment mark, 22 IC-side alignment mark, 23 inter-terminal spaces, 33 thermocompression head

The invention claimed is:

1. A connection body comprising:
an electronic component connected onto a circuit substrate via an anisotropic conductive adhesive agent;
wherein the anisotropic conductive adhesive agent has a binder resin in which conductive particles are arranged;
wherein the conductive particles in a space between connecting electrodes formed on the electronic component have an average inter-particle distance with respect to each other that is greater than an inter-particle distance of the conductive particles trapped between substrate electrodes formed on the circuit substrate and the connecting electrodes, and
wherein external tangent lines of the arranged conductive particles trapped between the substrate electrodes formed on the circuit substrate and the connecting electrodes intersect with adjacent conductive particles in a longitudinal direction of the substrate electrode and the connecting electrodes.

2. The connection body according to claim 1, wherein the anisotropic conductive adhesive has a conductive particle density of 5,000 particles/mm$^2$ or more.

3. The connection body according to claim 1, wherein the anisotropic conductive adhesive is film-formed with a length direction to be in an arrangement direction of the substrate electrodes and the connecting electrodes, the conductive particles being arranged to be sparse in the length direction and dense in a width direction.

4. The connection body according to claim 1, wherein the anisotropic conductive adhesive is film-formed with a length direction to be in an arrangement direction of the substrate electrodes and the connecting electrodes, the conductive particles being arranged to be dense in the length direction and sparse in a width direction.

5. The connection body according to claim 2, wherein the anisotropic conductive adhesive is film-formed with a length direction to be in an arrangement direction of the substrate electrodes and the connecting electrodes, the conductive particles being arranged to be sparse in the length direction and dense in a width direction.

6. The connection body according to claim 2, wherein the anisotropic conductive adhesive is film-formed with a length direction to be in an arrangement direction of the substrate electrodes and the connecting electrodes, the conductive particles being arranged to be dense in the length direction and sparse in a width direction.

7. The connection body according to claim 1, wherein a ratio of a number of the conductive particles trapped between the substrate electrodes and the connecting electrodes to a number of the conductive particles in the space between adjacent connecting electrodes is substantially the same as a ratio of a width of the connecting electrode to a width of the space between adjacent connecting electrodes.

8. The connection body according to claim 7, wherein the ratio of the number of the conductive particles trapped between the substrate electrodes and the connecting electrodes to the number of the conductive particles in the space between adjacent connecting electrodes and the ratio of the width of the connecting electrode to the width of the space between adjacent connecting electrodes are 3:5.

9. A method for manufacturing a connection body comprising:
mounting an electronic component onto a circuit substrate via an adhesive agent containing conductive particles; and
pressing the electronic component against the circuit substrate and curing the adhesive agent, thereby connecting the electronic component onto the circuit substrate;
wherein the anisotropic conductive adhesive has conductive particles arranged in a binder resin;
wherein connecting electrodes have a space therebetween in which the conductive particles have an average inter-particle distance with respect to each other that is greater than an inter-particle distance of conductive particles which are trapped between substrate electrodes formed on the circuit substrate and the connecting electrodes formed on the electronic component, and
wherein external tangent lines of the arranged conductive particles trapped between the substrate electrodes formed on the circuit substrate and the connecting electrodes intersect with adjacent conductive particles in a longitudinal direction of the substrate electrode and the connecting electrodes.

10. The method for manufacturing a connection body according to claim 9, wherein the anisotropic conductive adhesive has the conductive particles at a density of 5,000 particles/mm$^2$ or more.

11. The method for manufacturing a connection body according to claim 9 wherein the anisotropic conductive adhesive is film-formed with a length direction to be in an arrangement direction of the substrate electrodes and the connecting electrodes, the conductive particles being arranged to be sparse in the length direction and dense in a width direction.

12. The method for manufacturing a connection body according to claim 9, wherein the anisotropic conductive adhesive is film-formed with a length direction to be in an arrangement direction of the substrate electrodes and the connecting electrodes, the conductive particles being arranged to be dense in the length direction and sparse in a width direction.

13. The method for manufacturing a connection body according to claim 10, wherein the anisotropic conductive adhesive is film-formed with a length direction to be in an arrangement direction of the substrate electrodes and the connecting electrodes, the conductive particles being arranged to be sparse in the length direction and dense in a width direction.

14. The method for manufacturing a connection body according to claim 10, wherein the anisotropic conductive adhesive is film-formed with a length direction to be in an arrangement direction of the substrate electrodes and the connecting electrodes, the conductive particles being arranged to be dense in the length direction and sparse in a width direction.

15. The method for manufacturing a connection body according to claim 9, wherein a ratio of a number of the conductive particles trapped between the substrate electrodes and the connecting electrodes to a number of the conductive particles in the space between adjacent connecting electrodes is substantially the same as a ratio of a width of the connecting electrode to a width of the space between adjacent connecting electrodes.

16. The method for manufacturing a connection body according to claim 15, wherein the ratio of the number of the conductive particles trapped between the substrate electrodes and the connecting electrodes to the number of the conductive particles in the space between adjacent connecting electrodes and the ratio of the width of the connecting electrode to the width of the space between adjacent connecting electrodes are 3:5.

* * * * *